US009570866B2

(12) United States Patent
Lin

(10) Patent No.: US 9,570,866 B2
(45) Date of Patent: Feb. 14, 2017

(54) JACK ASSEMBLY AND PORTABLE ELECTRONIC DEVICE WITH SAME

(71) Applicant: Chiun Mai Communication Systems, Inc., New Taipei (TW)

(72) Inventor: Ding-Yu Lin, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 200 days.

(21) Appl. No.: 14/478,785

(22) Filed: Sep. 5, 2014

(65) Prior Publication Data

US 2015/0070857 A1 Mar. 12, 2015

(30) Foreign Application Priority Data

Sep. 11, 2013 (CN) ........................ 2013 1 04114971

(51) Int. Cl.

| | |
|---|---|
| ***H05K 5/00*** | (2006.01) |
| ***H01R 24/58*** | (2011.01) |
| ***H01R 13/623*** | (2006.01) |
| *H01R 13/52* | (2006.01) |
| *H01R 12/72* | (2011.01) |
| *H01R 13/74* | (2006.01) |

(52) U.S. Cl.

CPC ............ *H01R 24/58* (2013.01); *H01R 13/623* (2013.01); *H01R 12/722* (2013.01); *H01R 13/5219* (2013.01); *H01R 13/74* (2013.01)

(58) Field of Classification Search

USPC ..................... 361/752, 679.01; 439/271, 372

See application file for complete search history.

(56) References Cited

U.S. PATENT DOCUMENTS 7,722,379 B2 5/2010 Yang et al.
2011/0261022 A1* 10/2011 Liang ...................... G06F 3/039 345/179

FOREIGN PATENT DOCUMENTS

JP 1993-55471 7/1993

* cited by examiner

*Primary Examiner* — Andargie M Aychillhum
(74) *Attorney, Agent, or Firm* — Zhigang Ma

(57) ABSTRACT

A jack assembly includes a jack element, an elastic element, and at least one latching portion. The jack element defines a jack opening configured for receiving an electronic element therein. The elastic element is mounted in a side of the jack element. The at least one latching portion protrudes on the elastic element and extends towards the jack opening. The at least one latching portion detachably latches the electronic element to the jack opening so as to secure the electronic element within the jack opening.

15 Claims, 6 Drawing Sheets

JACK ASSEMBLY AND PORTABLE ELECTRONIC DEVICE WITH SAME

CROSS-REFERENCE TO RELATED APPLICATIONS

This application claims priority to Chinese Patent Application No. 201310411497.1 filed on Sep. 11, 2013, the contents of which are incorporated by reference herein.

FIELD

The disclosure generally relates to a jack assembly and a portable electronic device with the jack assembly.

BACKGROUND

Portable electronic device, such as a mobile phone or a personal digital assistant (PDA), commonly has a jack for receiving an electronic element, for example, an earphone plug. When the electronic element is used, an unexpected pull on a line of the electronic element may pull the electronic element out of the jack.

BRIEF DESCRIPTION OF THE DRAWINGS

Implementations of the present technology will now be described, by way of example only, with reference to the attached figures.

DETAILED DESCRIPTION

Figure 1:
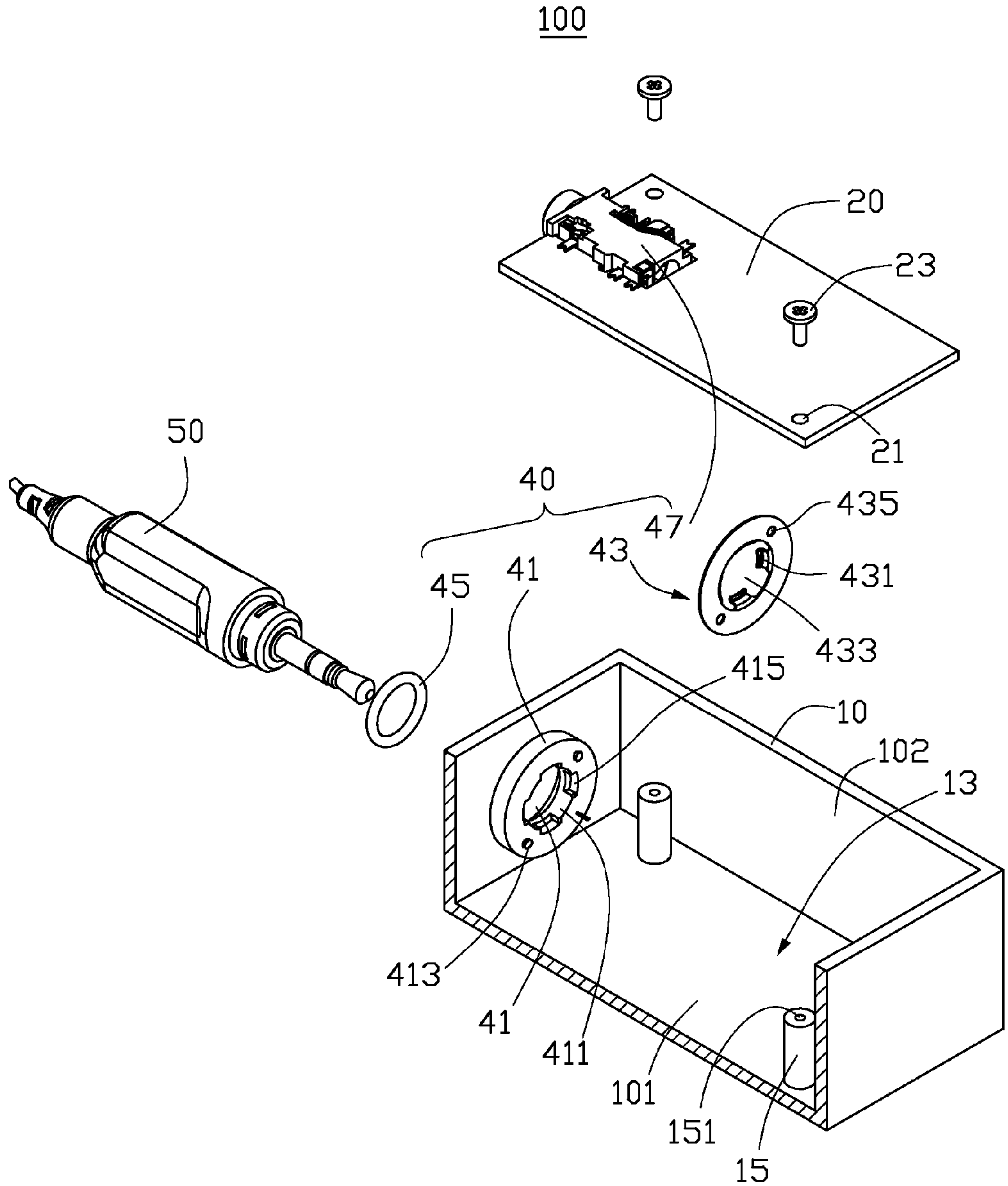
FIG. 1 is an exploded, isometric view of an embodiment of a portable electronic device for receiving an electronic element.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

FIG. 1 illustrates an embodiment of a portable electronic device 100. The portable electronic device 100 may be a mobile phone, a personal digital assistant (PDA), or a handheld computer. The portable electronic device 100 includes a housing 10, a circuit board 20, and a jack assembly 40. The circuit board 20 and the jack assembly 40 are both positioned in the housing 10. The jack assembly 40 is electronically connected to the circuit board 20 and is configured to receive and latch an electronic element 50. In this embodiment, the electronic element 50 is an earphone.

The housing 10 includes a bottom surface 101 and a peripheral wall 102. The peripheral wall 102 extends substantially perpendicularly from a periphery of the bottom surface 101. An assembling hole 11 is defined in an inner surface of the peripheral wall 102 and an outside surface of the peripheral wall 102. The bottom surface 101 and the peripheral wall 102 cooperatively form a mounting space 13. The mounting space 13 communicates with the assembling hole 11.

As illustrated, the housing 10 further includes at least one post 15. In this embodiment, there are two posts 15. The two posts 15 are positioned in the bottom surface 101 and each post 15 defines an axis hole 151.

The circuit board 20 can be received in the mounting space 13. The circuit board 20 includes at least one mounting hole 21 corresponding to the at least one post 15 and at least one mounting element 23. In this embodiment, there are two mounting holes 21 and two mounting elements 23. The mounting elements 23 can be screws. The circuit board 20 is received in the mounting space 13 through the two mounting elements 23 extending through the corresponding mounting holes 21 and the axis holes 151, and is supported by the posts 15. In other embodiments, the circuit board 20 can be received in the mounting space 13 through other means.

The jack assembly 40 includes a jack element 41, an elastic element 43, a sealing element 45, and a connector 47. The jack element 41 is positioned in the inner surface of the peripheral wall 102 and defines a jack 411. The jack 411 is aligned with the assembling hole 11 and communicates with the assembling hole 11 and the mounting space 13.

The elastic element 43 is substantially a closed ring and is assembled in a side of the jack element 41 opposite to the outside surface of the peripheral wall 102. The elastic element 43 includes at least one latching portion 431. In this embodiment, there are four latching portions 431 and the latching portions 431 can be hooks. A through hole 433 is defined in the middle of the elastic element 43. The latching portions 431 protrude from the edge of the through hole 433 and are inclined towards the through hole 433. At least one positioning hole 435 is defined in the elastic element 43. The jack element 41 further includes at least one protrusion 413 corresponding to the at least one positioning hole 435. In this embodiment, there are two positioning holes 435 and two protrusions 413. The elastic element 43 can be secured to the jack element 41 through the two protrusions 413 engaging in the positioning holes 435.

As illustrated, at least one receiving slot 415 corresponding to the at least one latching portion 431 is defined and recessed in a bottom surface of the jack 411. The at least one receiving slot 415 communicates with the jack 411 and is configured to releasably receive the latching portions 431.

Figure 2:
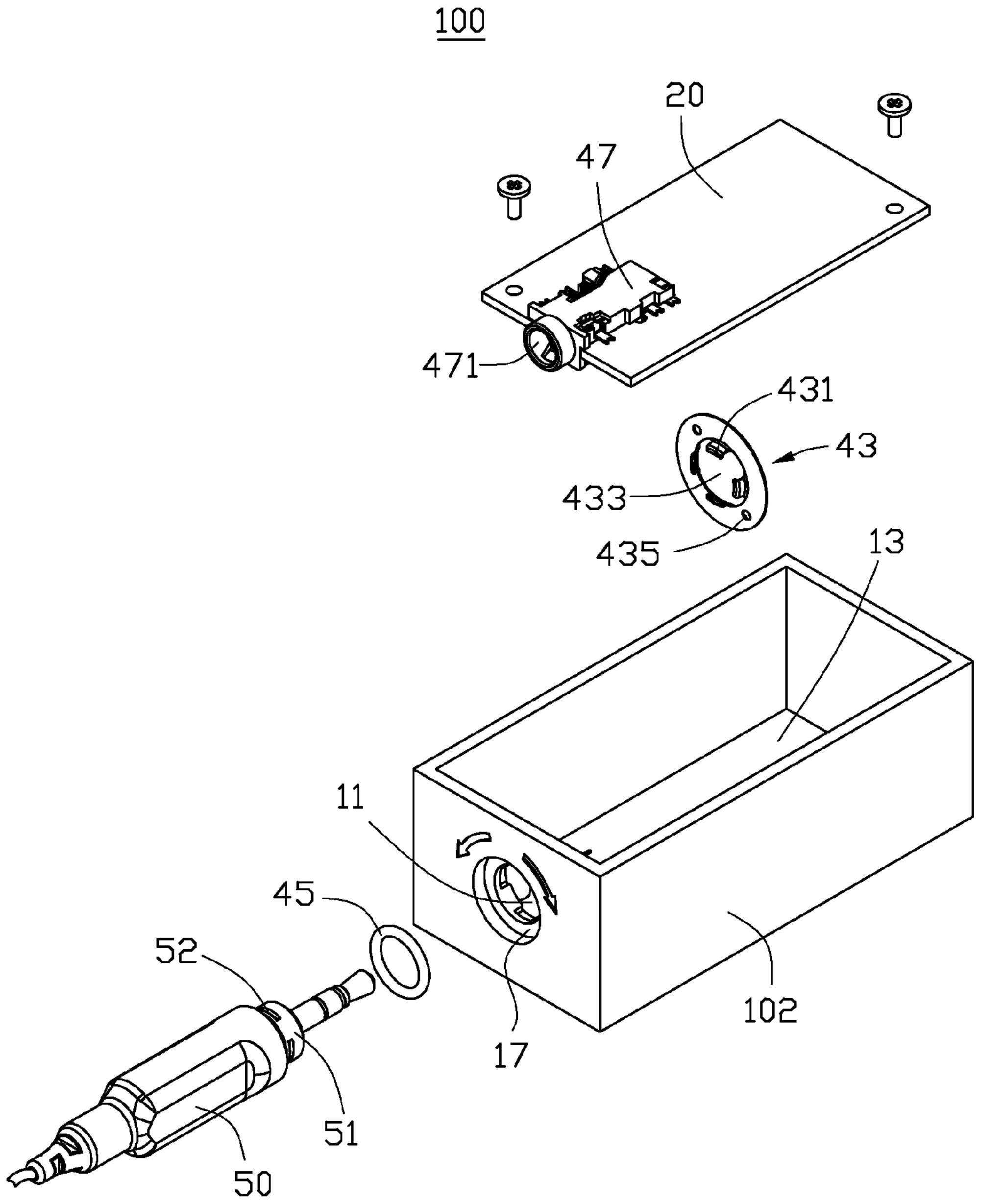
FIG. 2 is similar to FIG. 1, but shown from another angle.

FIG. 2 shows one portion of the jack element 41 is exposed from the assembling hole 11, that is, one portion of the jack element 41 seals a portion of the assembling hole 11, thereby to form a stepped recess 17.

The sealing member 45 is secured in the stepped recess 17 and seals gaps between the electronic element 50 and the jack element 41 when the electronic element 50 is received in the jack 411. In this embodiment, the sealing member 45 can be made of resilient materials, such as rubber, sealing cushion.

The connector 47 is positioned on a side of the circuit board 20 and is electronically connected to the circuit board 20. The connector 20 includes a port 471. The port 471 is aligned with the assembling hole 11 and the jack 411. The port 471 is configured to receive the electronic element 50 to form an electrical connection with the electronic element 50.

As illustrated, the electronic element 50 includes a plug 51. The plug 51 defines at least one matching groove 52 corresponding to the latching portion 431. The electronic element 50 is latched in the jack 411 when the latching portion 431 is received in the matching groove 52 and the electronic element 50 is unlatched with the jack 411 when the latching portion 431 slides out of the matching groove 52.

Figure 3:
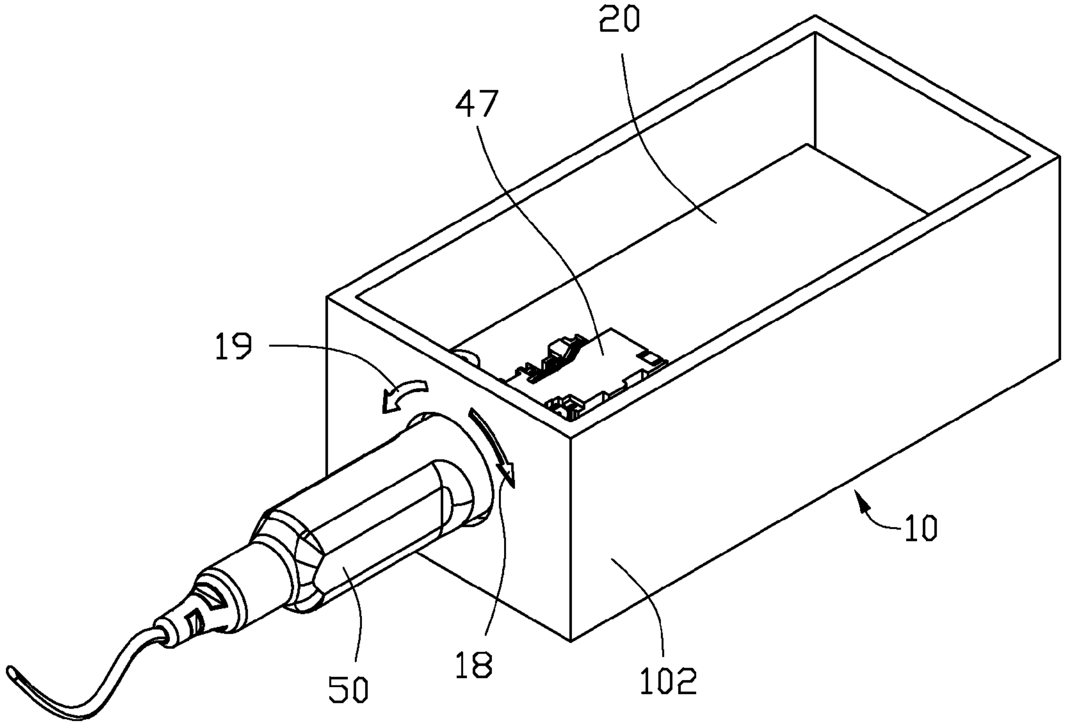
FIG. 3 is an assembled, isometric view of the portable electronic device of FIG. 2.

FIG. 3 shows the housing 10 includes a first label 18 and a second label 19. The first label 18 and the second label 19 are positioned in the outside surface of the peripheral wall 102 and are adjacent to the assembling hole 11. In this embodiment, the first label 18 and the second label 19 are configured to indicate a rotate direction of the electronic element 50. For example, when the electronic element 50 is received in the jack 411 and is rotated along a direction indicated by the first label 18 (for example, clockwise), the element 50 is latched by the latching portion 431. When the electronic element 50 is received in the jack 411 and is rotated along a direction indicated by the second label 19 (for example, counterclockwise), the element 50 is unlatched with the latching portion 431.

Figure 4:
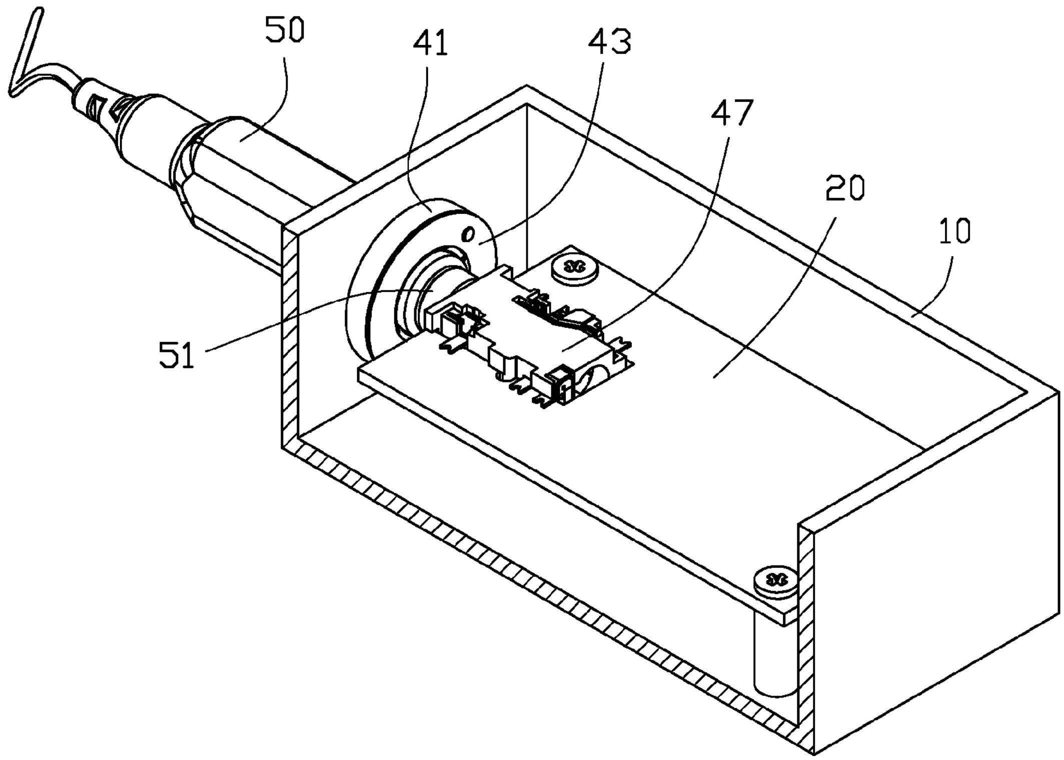
FIG. 4 is an isometric, partially cross-sectional view of the portable electronic device of FIG. 3.

Referring to FIG. 4, in assembly, the jack element 41 is secured in the inner surface of the peripheral wall 102 and is aligned with the assembling hole 11. The protrusions 413 of the jack element 41 extend through the positioning holes 435, and the elastic element 43 is secured on a side of the jack element 41 opposite to the outside surface of the peripheral wall 102 through glue or other adhesive means. Then, the latching portions 431 extend towards the through hole 433 and are apart from the receiving slot 415. The mounting hole 21 of the circuit board 20 is aligned with the axis hole 151 of the post 15. The mounting element 23 is inserted into the mounting hole 21 and the axis hole 151. Therefore, the circuit board 20 is secured in the mounting space 13 of the housing 10 and is supported by the ports 15. The sealing element 45 is received in the stepped recess 17 and is exposed from the assembling hole 11.

Figure 5:
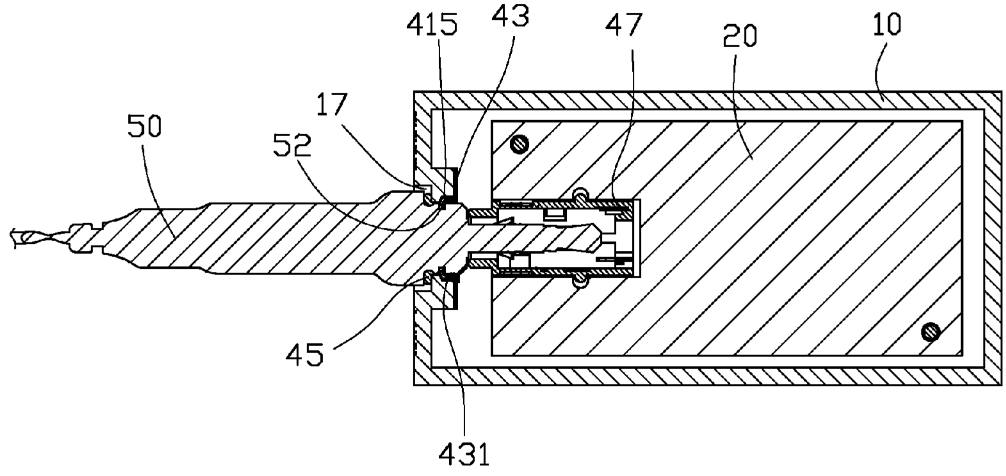
FIG. 5 is a cross-sectional view of the portable electronic device of FIG. 3, showing the electronic element latched in a jack assembly of the portable electronic device.

FIG. 5 shows the electronic element 50 is pushed and received in the jack 411. A periphery of the plug 51 resists the latching portions 431 and the latching portions 431 are compressed to be received in the receiving slots 415. Then, the electronic element 50 is rotated along a direction indicated by the first label 18 (for example, clockwise) until the latching portion 431 slides into the matching groove 52 of the electronic element 50 and the electronic element 50 forms an electrical connection with the port 471 of the connector 47. The electronic element 50 is latched by the latching portions 431 and the sealing element 45 is sandwiched between the stepped recess 17 and the electronic element 50 to seal gaps between the electronic element 50 and the jack element 41.

Figure 6:
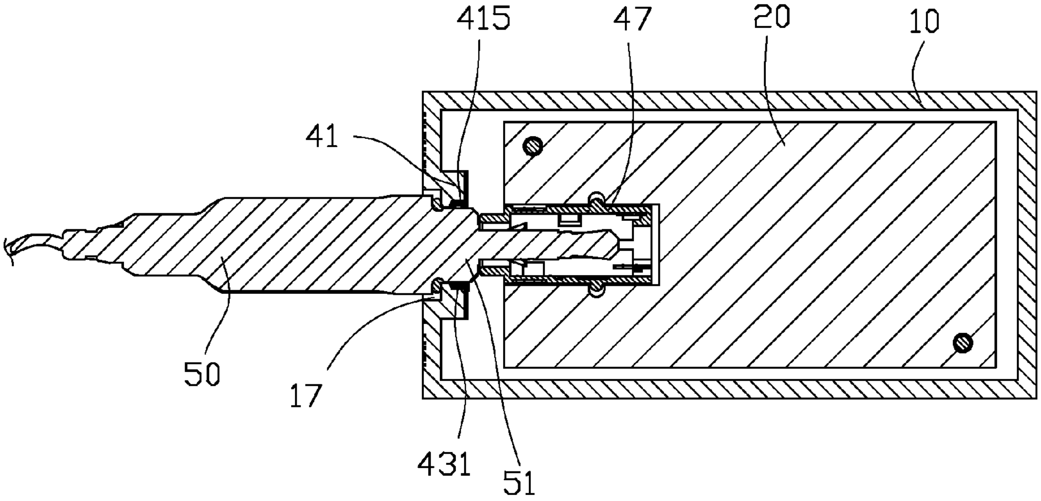
FIG. 6 is similar to FIG. 5, but showing the electronic element unlatched with the jack assembly of the portable electronic device.

Referring to FIG. 6, the electronic element 50 is rotated along a direction indicated by the second label 19, for example, counterclockwise, the latching portion 431 slides out the matching groove 52 of the electronic element 50 and the periphery of the plug 51 resists the latching portions 431 again to cause the latching portions 431 to be compressed and received in the receiving slots 415. The electronic element 50 is unlocked with the jack assembly 40 and can be pulled out from the jack 411.

In other embodiments, the matching grooves 52 of the electronic element 50 can be omitted. An elastic intensity of the latching portions 431 or an inclined angle of the latching portion 431 can be adjusted to cause the electronic element 50 be latched by elasticity of the latching portion 431 and a friction of the electronic element 50.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A jack assembly comprising:

a jack element defining a jack opening configured to receive an electronic element therein;

an elastic element mounted in a side of the jack element, the elastic element comprising at least one latching portion protruding therefrom and extending towards the jack opening;

wherein the at least one latching portion detachably latches the electronic element to the jack opening so as to secure the electronic element within the jack opening;

wherein at least one positioning hole is defined in the elastic element, the jack element comprises at least one protrusion corresponding to the at least one positioning hole, the elastic element is mounted to the jack element through the at least one protrusion engaging in the corresponding positioning hole.

2. The jack assembly of claim 1, wherein the elastic element defines a through hole in the middle of thereof, and the at least one latching portion protrudes from the edge of the through hole and is inclined towards the through hole.

3. The jack assembly of claim 1, wherein the jack element defines at least one receiving slot which is recessed in a bottom surface of the jack opening and communicates with the jack opening, the at least one latching portion is releasably received in the receiving slot.

4. The jack assembly of claim 1, further comprising a sealing member, wherein the sealing member is mounted in another side of the jack element opposite to the elastic element and seals gaps between the electronic element and the jack element when the electronic element is received in the jack.

5. The jack assembly of claim 1, further comprising a connector, wherein the connector is positioned at a side of the elastic element opposite to the jack element and comprises a port which is aligned with the jack opening, the port is configured to receive the electronic element to form an electrical connection with the electronic element.

6. A portable electronic device for receiving an electronic element, the portable electronic device comprising:

a housing; and a jack assembly, the jack assembly comprising:

a jack element positioned in the housing and defining a jack opening configured for receiving the electronic element therein;

an elastic element mounted in a side of the jack element, the elastic element comprising at least one latching portion protruding therefrom and extending towards the jack opening;

wherein the at least one latching portion detachably latches the electronic element to the jack opening so as to secure the electronic element within the jack opening;

wherein at least one positioning hole is defined in the elastic element, the jack element comprises at least one protrusion corresponding to the at least one positioning hole, the elastic element is mounted to the jack element through the at least one protrusion engaging in the corresponding positioning hole.

7. The portable electronic device of claim 6, wherein the elastic element defines a through hole in the middle of thereof, and the at least one latching portion protrudes from the edge of the through hole and is inclined towards the through hole.

8. The portable electronic device of claim 6, wherein the jack element defines at least one receiving slot which is recessed in a bottom surface of the jack opening and communicates with the jack opening, the at least one latching portion is releasably received in the receiving slot.

9. The portable electronic device of claim 6, further comprising a sealing member, wherein the sealing member is mounted in another side of the jack element opposite to the elastic element and seals gaps between the electronic element and the jack element when the electronic element is received in the jack.

10. The portable electronic device of claim 6, further comprising a connector, wherein the connector is positioned at a side of the elastic element opposite to the jack element and comprises a port which is aligned with the jack opening, the port is configured to receive the electronic element to form an electrical connection with the electronic element.

11. The portable electronic device of claim 10, further comprising a circuit board, the circuit board is received in the housing, and the connector is secured on the circuit board and is electronically connected to the circuit board.

12. The portable electronic device of claim 11, wherein the housing comprises a bottom surface and a peripheral wall extending substantially perpendicularly from a periphery of the bottom surface, an assembling hole is defined in an inner surface of the peripheral wall and an outside surface of the peripheral wall, the jack element is positioned in the peripheral wall with the jack align with the assembling hole.

13. The portable electronic device of claim 12, wherein the bottom surface and the peripheral wall cooperatively define a mounting space for mounting the circuit board.

14. The portable electronic device of claim 13, wherein at least one post protrudes on the bottom surface, the at least one post defines an axis hole, the circuit board defines at least one mounting hole corresponding to the at least one post and at least one mounting element, the circuit board is received in the mounting space through the at least one mounting element extending through the he at least one mounting hole and the axis holes.

15. The portable electronic device of claim 6, wherein the housing comprises a first label and a second label, the first label and the second label are configured to indicate a rotate direction of the electronic element.

* * * * *